United States Patent
Stadnick et al.

(10) Patent No.: US 6,229,282 B1
(45) Date of Patent: May 8, 2001

(54) LOW-VOLTAGE-DROP, SPRING-ACTIVATED BYPASS OF FAILED BATTERY CELL

(75) Inventors: Steven J. Stadnick, Lakewood; Howard H. Rogers, Torrance, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/650,109

(22) Filed: Aug. 29, 2000

Related U.S. Application Data

(63) Continuation-in-part of application No. 09/532,624, filed on Mar. 22, 2000.

(51) Int. Cl.[7] .............................. H02J 7/00; H01L 23/62
(52) U.S. Cl. ......................................... 320/122; 257/665
(58) Field of Search .............................. 320/122; 257/665

(56) References Cited

U.S. PATENT DOCUMENTS

| | | | |
|---|---|---|---|
| 3,213,345 | * 10/1965 | Loftus .................................. | 320/122 |
| 3,669,744 | 6/1972 | Tsenter et al. . | |
| 4,000,350 | 12/1976 | Wittman . | |
| 4,250,235 | 2/1981 | DuPont et al. . | |
| 4,262,061 | 4/1981 | Rogers . | |
| 4,283,844 | 8/1981 | Milden et al. . | |
| 4,303,877 | * 12/1981 | Meinhold .............................. | 320/122 |
| 4,369,212 | 1/1983 | Rogers et al. . | |
| 4,683,178 | 7/1987 | Stadnick et al. . | |
| 4,774,558 | * 9/1988 | Herrin .................................. | 257/665 |
| 5,227,259 | * 7/1993 | Weaver et al. ........................ | 429/29 |
| 5,283,512 | * 2/1994 | Stadnick et al. ...................... | 320/18 |
| 5,324,597 | * 6/1994 | Leadbetter et al. .................... | 429/62 |
| 5,362,576 | * 11/1994 | Clark et al. .............................. | 429/7 |
| 5,898,356 | * 4/1999 | Gascoyne et al. ..................... | 337/15 |
| 6,021,332 | * 2/2000 | Alberth, Jr. et al. ................ | 455/552 |
| 6,087,035 | 7/2000 | Rogers et al. . | |

* cited by examiner

*Primary Examiner*—Peter S. Wong
*Assistant Examiner*—Gregory J Toatley, Jr.
(74) *Attorney, Agent, or Firm*—T. Gudmestad

(57) ABSTRACT

A battery system includes an electrical storage cell having a positive terminal and a negative terminal. The electrical storage cell is provided with a normally open bypass circuit path that is closed in the event of an open-circuit failure of the electrical storage cell. The bypass circuit path includes a first electrical conductor connected to the positive terminal of the electrical storage cell, a second electrical conductor connected to the negative terminal of the electrical storage cell, and a shorting gap between the first electrical conductor and the second electrical conductor. A mass of a fusible material is positioned at an initial mass location. A spring is positioned to force the mass of the fusible material from the initial mass location, along the metal flow path, and into the shorting gap, when the mass of the fusible material is at least partially molten. A heat source is activatable upon the occurrence of an open-circuit condition of the electrical storage cell. The heat source is operable to melt at least a portion of the mass of the fusible material. The spring forces the molten material into the shorting gap, where it solidifies and closes the shorting gap so that the first electrical conductor is in electrical communication with the second electrical conductor.

19 Claims, 5 Drawing Sheets

LOW-VOLTAGE-DROP, SPRING-ACTIVATED BYPASS OF FAILED BATTERY CELL

This application is a continuation-in-part of prior application Ser. No. 09/532,624, filed Mar. 22, 2000 still pending, for which priority is claimed and whose disclosure is incorporated by reference.

This invention relates to electrical storage batteries, and, more particularly, to a shorting bypass of an electrical storage cell operable when the cell fails in the open-circuit condition.

BACKGROUND OF THE INVENTION

Rechargeable cells or batteries are electrochemical energy storage devices for storing and retaining an electrical charge and later delivering that charge as useful power. Familiar examples of the rechargeable electrical storage cell are the lead-acid cell used in automobiles and the nickel-cadmium cell used in various portable electronic devices. Another type of electrical storage cell having a greater storage capacity for its weight and longer life is the nickel oxide/pressurized hydrogen electrical storage cell, an important type of which is commonly called the nickel-hydrogen electrical storage cell and is used in spacecraft applications. The weight of the spacecraft electrical storage cell must be minimized while achieving the required performance level, due to the cost of lifting weight to an earth orbit and beyond.

The nickel-hydrogen electrical storage cell includes a series of active plate sets which store an electrical charge electrochemically and later deliver that charge as a useful current. The active plate sets are packaged within a hermetic pressure vessel that contains the plate sets and the hydrogen gas that is an essential active component of the electrical storage cell. A single nickel-hydrogen electrical storage cell delivers current at about 1.3 volts, and a number of the electrical storage cells are usually electrically interconnected in series to produce current at the voltage required by the systems of the spacecraft.

Although the electrical storage cells are designed for excellent reliability, there is always the chance of a failure. One failure mode of the electrical storage cell is an open-circuit failure, in which there is no longer a conducting path through the electrical storage cell. In the event of an open-circuit failure of a single electrical storage cell in a series-connected array of cells, all of the storage capacity of the array is lost.

A bypass around a potentially failed cell is required to prevent loss of the storage capacity of the entire array. The bypass must not conduct when the electrical storage cell is functioning properly, but it must activate to provide an electrically conductive bypass when the electrical storage cell fails in the open-circuit mode. The use of bypass rectifier diodes and relays to provide this bypass function is known, but these bypass devices add a considerable amount of weight to each of the electrical storage cells, and a separate bypass is required for each of the 24 or more storage cells in a typical battery system. Additionally, the bypass diode has a relatively high voltage drop that dissipates power when it functions as a bypass, and the relay itself has the potential for failure.

There is a need for an improved technique for achieving an electrical bypass of electrical storage cells. The present invention fulfills that need, and further provides related advantages.

SUMMARY OF THE INVENTION

The present invention provides an electrical bypass for a failed-open electrical storage cell. The bypass is extremely light in weight. It passes no current when the electrical storage cell operates normally, but is activated as the electrical storage cell fails to the open-circuit state. When activated, the bypass has a low electrical resistance, so that it does not dissipate much power as the remainder of the battery is charged and discharged. Any significant dissipated power tends to overload the heat-dissipation structure of the spacecraft and is a drain on the power supply of the system.

In accordance with the invention, a battery system comprises an electrical storage cell having a positive terminal and a negative terminal. A normally open bypass circuit path comprises a first electrical conductor connected to the positive terminal of the electrical storage cell, a second electrical conductor connected to the negative terminal of the electrical storage cell, and a shorting gap between the first electrical conductor and the second electrical conductor. A mass of a fusible material is positioned at an initial mass location. At this initial mass location, the mass of the fusible material does not close or short the shorting gap. A heat source, activatable upon the occurrence of an open-circuit condition of the electrical storage cell, is operable to melt at least a portion of the mass of the fusible material. A biasing mechanism, which preferably comprises a spring, is positioned to force the mass of the fusible material into the shorting gap, when the mass of the fusible material is at least partially molten (and preferably nearly completely melted), thereby closing the shorting gap so that the first electrical conductor is in electrical communication with the second electrical conductor.

The heat source is preferably at least one diode. In one embodiment, the diode has a cathode and an anode. The cathode of the diode is electrically connected to the positive terminal of the electrical storage cell, and the anode of the diode is electrically connected to the negative terminal of the electrical storage cell. The diode and its electrical resistance are sized such that, as the electrical storage cell begins to fail and a large electrical current passes through the diode, the diode heats to a sufficiently high temperature to melt at least some (and preferably all or nearly all) of the fusible material, leading to closure of the shorting gap as the biasing mechanism rapidly drives the molten fusible material into the gap. As the shorting gap is quickly closed, its electrical resistance rapidly falls and the bypassing current flows through the fusible material and the first and second electrical conductors rather than through the diode. Consequently, the electrical resistance, and thence heat generation, of the bypass circuit falls.

The closure of the shorting gap by the fusible material may be accomplished in any of several ways. The fusible material may be a metallic electrical conductor such as a solder that flows into the shorting gap upon melting and provides a good electrical conduction path. The flow may be aided by providing a partially or fully tinned flow path from the initial mass location to the shorting gap. To ensure that the molten fusible material flows into the shorting gap, the biasing mechanism forces the molten fusible material toward the shorting gap. Completion of the flow of the molten fusible material into the shorting gap is aided by capillary action, but the biasing mechanism provides the primary driving force. When the fusible material enters the gap and the resistance of the bypass circuit path falls, the heat produced by resistance heating also falls, and the metal re-solidifies to firmly fix the electrical conductor in the gap and permanently electrically short the gap.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
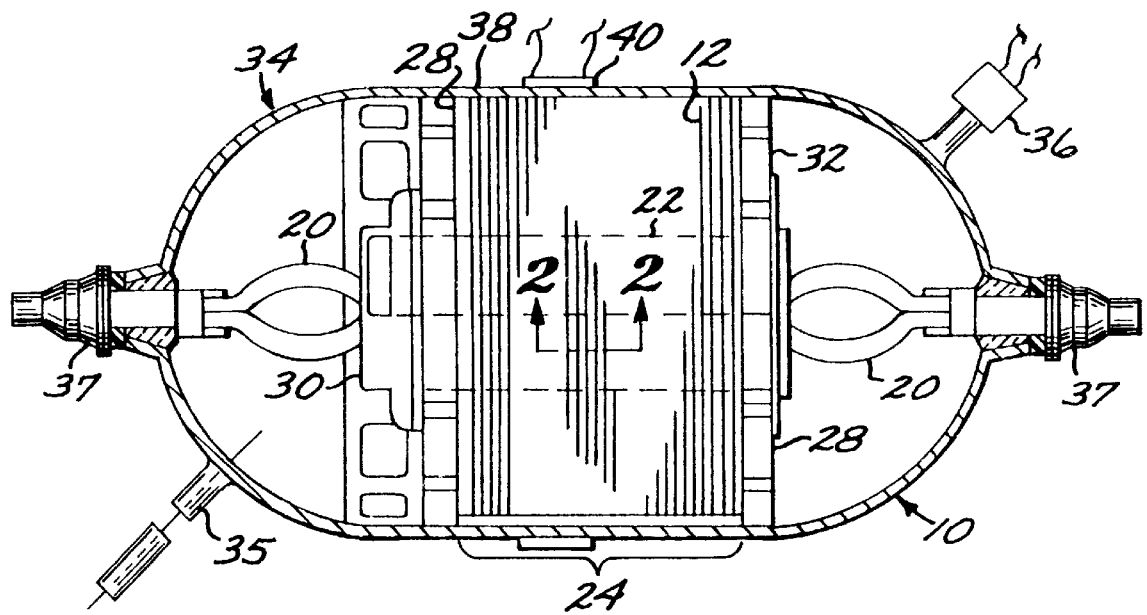
FIG. 1 is a sectional elevational view of a flight-type nickel-hydrogen energy storage cell.
Figure 2:
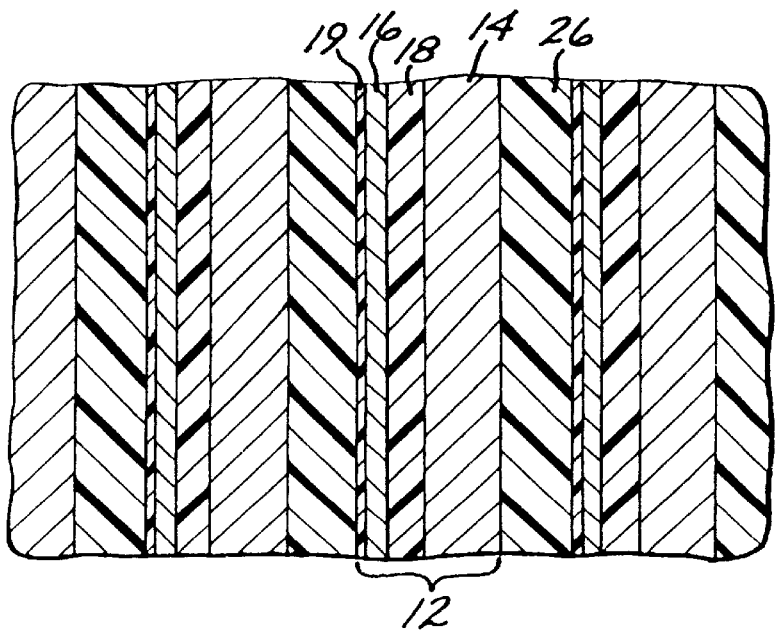
FIG. 2 is a detail of FIG. 1, taken generally on line 2—2 and illustrating the plate sets.

The present invention is preferably used in conjunction with a number of electrically interconnected nickel-hydrogen electrical storage cells 10, one of which is illustrated in FIGS. 1–2, of the pressurized gas-metal cell type. (The invention is operable with other types of battery systems, such as nickel-cadmium cells, as well.) Such an electrical storage cell 10 typically comprises a plurality of individual plate sets 12. Each plate set in turn comprises an anode or positive electrode 14, a cathode or negative electrode 16, and an electrolyte-containing separator 18, which physically separates the electrodes 14 and 16 and also supplies the electrolyte medium through which ionic and electronic charge transfer occurs. Charging and discharging of the electrodes 14 and 16 are accomplished through respective electrical leads 20.

Various constructions of nickel-hydrogen cells and components are known in the art and are disclosed, for example, in the following U.S. Pat. Nos. 4,683,178; 4,369,212; 4,283,844; 4,262,061; 4,250,235; 4,000,350; and 3,669,744.

In a typical and preferred construction, the positive electrode 14 is formed by impregnating nickel hydroxide into porous sintered nickel that is supported on an etched nickel electrode substrate. The negative electrode 16 is coated on one side by a sintered mixture of platinum black and polytetrafluoroethylene and on the other side with a porous layer 19 of polytetrafluoroethylene. These layers are applied to a nickel substrate in the form of an etched sheet or a woven mesh, to form the negative electrode 16. Many different types of separators 18 are known, including, for example, asbestos, nylon, and a cloth of zirconium oxide-yttrium oxide. The electrolyte, preferably a 26 or 31 percent by weight concentration of aqueous potassium hydroxide, is impregnated into the separator 18.

The individual plate sets 12 are assembled onto a central core 22 to form a stacked array 24. A monofilament polypropylene screen 26 is placed between each plate set 12 during assembly, so that oxygen liberated during overcharging at each positive electrode 14 can diffuse away from the positive electrode 14 and to the negative electrode 16 to combine with hydrogen. The stacked array 24 is placed under a longitudinal pressure of, for example, about 10 pounds per square inch, by tightening compression plates 28 against each end of the stacked array 24. The tightening of the compression plates 28 is preferably accomplished by compressing the array 24 and then tightening a nut 30 on threads on the core 22, thereby compressing a Belleville washer set 32 against the compression plate 28 to hold the stacked array 24 in place.

The stacked array 24 is contained within a hermetically sealed pressure vessel 34 having a wall 38 manufactured of a wall material such as Inconel 718 nickel-base alloy which can withstand internal pressures on the order of 1,000 psia, without damage by hydrogen embrittlement. The wall material has a relatively low diffusion coefficient of hydrogen therethrough, so that hydrogen is contained within the interior of the pressure vessel 34. A gas fill tube 35 allows gas content and pressure within the pressure vessel 34 to be established initially, and the tube 35 is sealed after the initial charging procedures. The pressure vessel 34 is typically constructed in the form of a cylindrical tube having domed ends. By way of illustration, the nickel-hydrogen electrical storage cell 10 having the pressure vessel 34 of external dimensions of 3½ to 5½ inches in diameter by 13–15 inches long contains about 40–100 individual plate sets 12, with a resulting electrical storage capacity of the cell of about 50 to about 350 ampere-hours. The electrical storage cell 10 may be charged and discharged through thousands of cycles without apparent damage, if the charging and discharging are accomplished properly.

The electrical leads 20 pass from the interior of the pressure vessel 34 to its exterior through electrical feedthroughs 37. The pressure within the pressure vessel 34 may optionally be monitored by any operable technique. One such pressure-monitoring device is a pressure gauge 36 communicating with the interior of the pressure vessel, which measures interior pressure directly. Another pressure-monitoring device is a strain gage 40 mounted to the exterior of the wall 38 of the pressure vessel 34. The deformation of the wall 38, as measured by the strain gage 40, is a function of the internal pressure within the pressure vessel 34, which functional dependence is determined in initial calibration testing. The strain gage 40 approach to pressure measurement is preferred, inasmuch as the strain gage is lighter than the pressure gauge.

When discharging, each of the electrical storage cells 10 delivers output power at about 1.3 volts, which is too low for many spacecraft requirements. To obtain higher voltages, a number of individual electrical storage cells 10 are ordinarily combined in electrical series arrangement as a battery.

Figure 3:
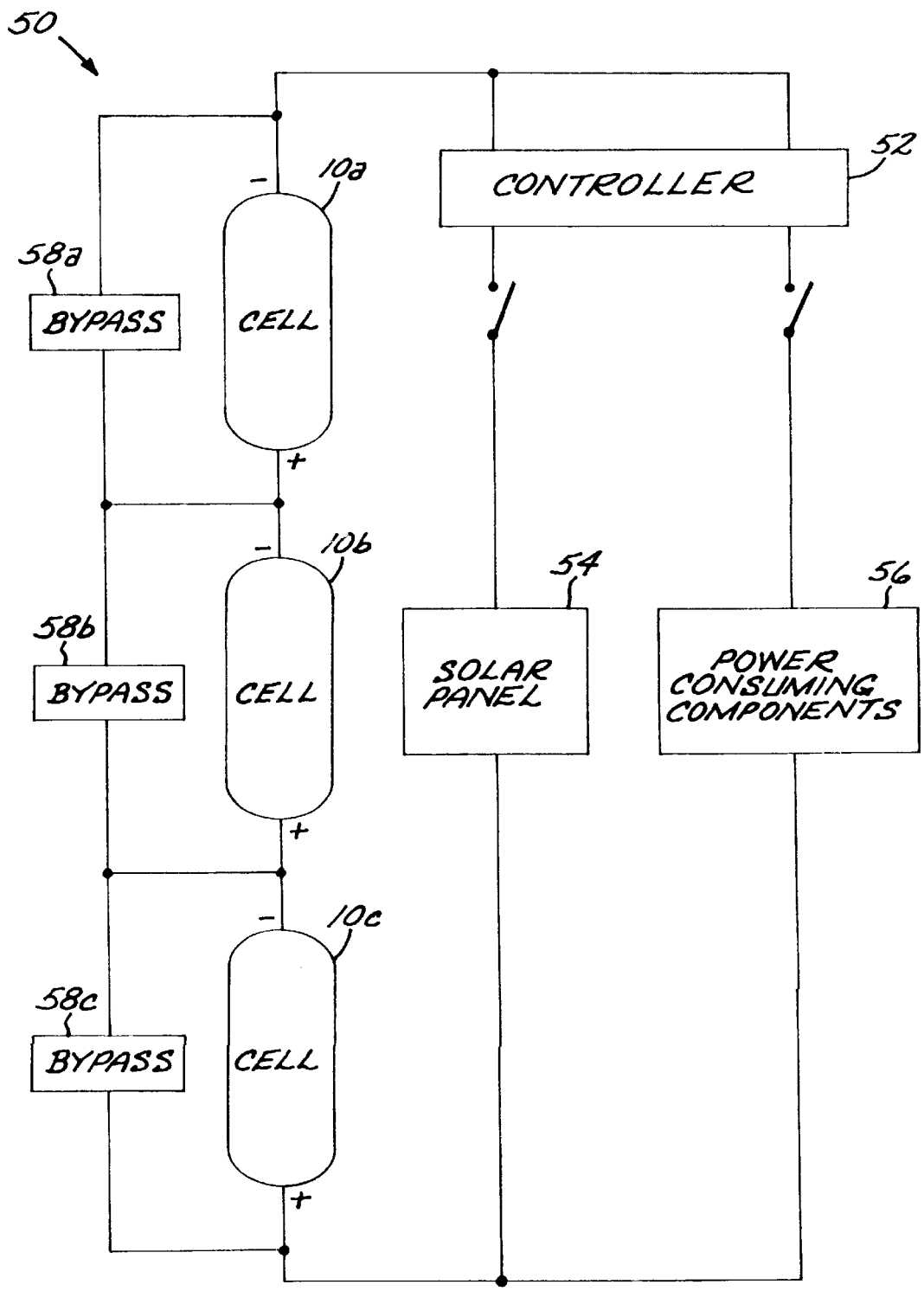
FIG. 3 is a schematic representation of a battery system having bypass circuit paths according to the invention.

FIG. 3 illustrates a battery system 50 having three electrical storage cells 10a, 10b, and 10c in an electrical series arrangement, although in practice the number of electrical storage cells in series is usually greater. Operating through a controller 52, the electrical storage cells 10 are charged by a solar panel power supply 54 and discharge to provide power to power consuming components 56.

The electrical storage cells 10 are designed for use over a period of many years, with excellent reliability. However, failures may occur so that the electrical path through the electrical storage cell fails to an open circuit. For example, if the hydrogen gas leaks out of the pressure vessel 34 due to the failure of a seal or due to a pinhole in the wall caused by a micrometeorite impact, the electrical storage cell fails to an open-circuit state so that electrical current does not flow through the electrical storage cell. The consequences of such a failure are compounded if the failed electrical storage cell is in series with other electrical storage cells, as shown in FIG. 3, because these other electrical storage cells are rendered useless by the open-circuit failure of the one electrical storage cell.

To remove a failed storage cell 10 from the series arrangement, a bypass 58 is provided for each storage cell 10. There is a bypass 58a for cell 10a, a bypass 58b for cell 10b, and a bypass 58c for cell 10c. When the cell 10 functions normally, the bypass 58 is inactive and carries no current. Upon failure of the cell 10 to an open-circuit condition, the bypass 58 becomes active and carries current around the failed cell. The remaining properly functioning cells continue to store and deliver power, but at a diminished voltage.

Figure 4:
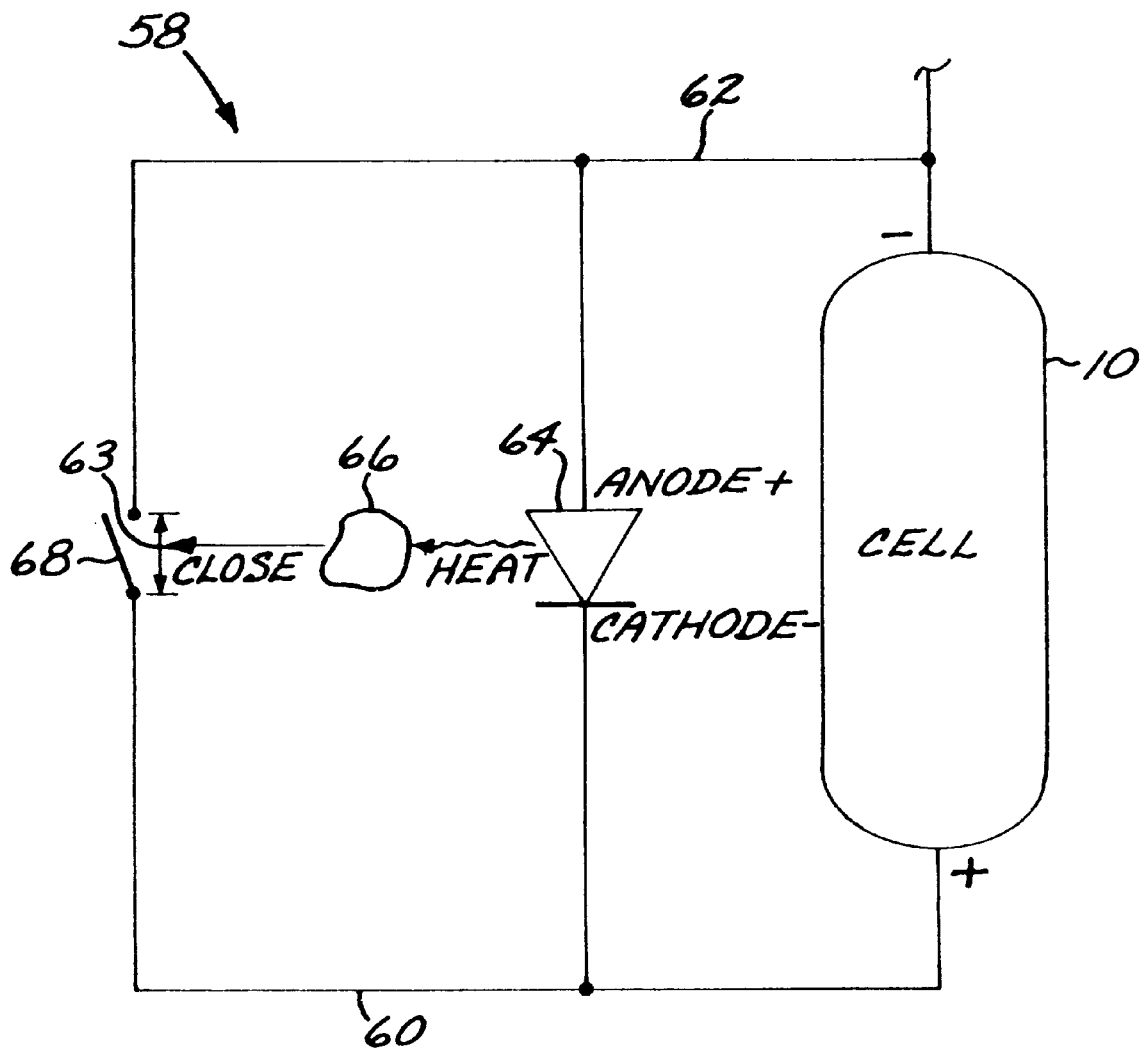
FIG. 4 is a schematic circuit diagram of a first preferred embodiment of a bypass circuit.

FIG. 4 is the equivalent circuit diagram of a preferred embodiment of the bypass 58. A first electrical conductor 60 is connected to the positive terminal of the cell 10, and a second electrical conductor 62 is connected to the negative terminal of the cell 10. The first electrical conductor 60 and the second electrical conductor 62 are separated by a shorting gap 63, so that when the cell 10 operates normally, no current flows through the conductors 60 and 62.

At least one diode 64 is connected across the cell 10 such that the cathode (negative terminal) of the diode 64 is connected to the positive terminal of the cell 10, and the anode (positive terminal) of the diode 64 is connected to the negative terminal of the cell 10. If the voltage across the diode 64 is negative at the anode and positive at the cathode, as in normal operation of the cell 10, no significant current flows through the diode 64. If the cell 10 fails to an open-cell condition, the voltage across the diode 64 reverses, and current flows through the diode 64 in the forward direction. The diode 64 is sized so that the current flowing through the diode, typically about 50–300 amperes in the case of a typical series arrangement of nickel-hydrogen cells 10, causes the diode 64 to heat substantially, to a temperature that is typically about 200–220° C.

A mass of a fusible material 66 is positioned at an initial mass location such that it is not within the shorting gap 63, but such that it is heated and melted by the heat produced by the diode 64. The melted fusible material 66 is driven into the shorting gap 63 and serves to cause the shorting gap to be closed, which closure is indicated schematically by a switch 68 in FIG. 4. The fusible material 66 may be any material whose properties are appropriate for the physical nature of the switch.

Figure 5:
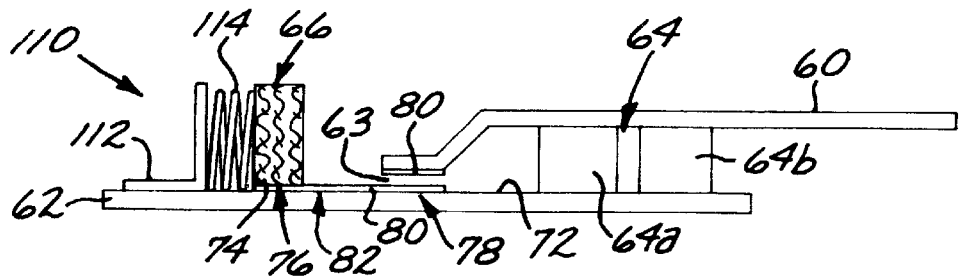
FIG. 5 is a schematic elevational diagram of a first preferred embodiment of the physical arrangement of the bypass system.
Figure 6:
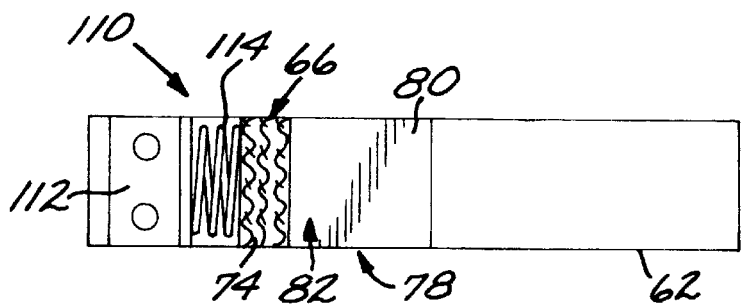
FIG. 6 is a partial plan view of a preferred biasing mechanism used in the embodiment of FIG. 5.
Figure 7:
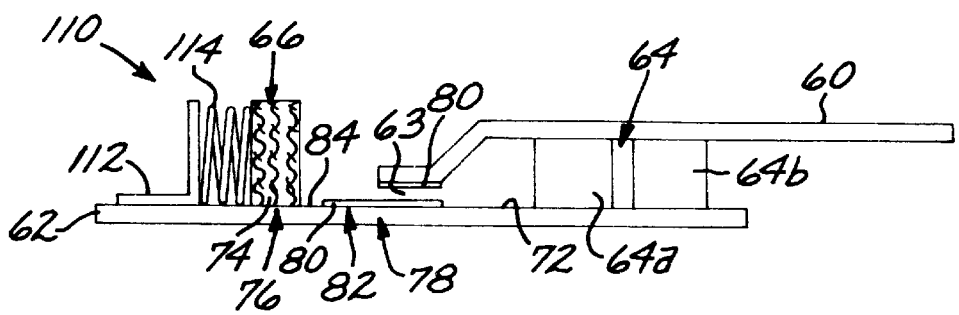
FIG. 7 is a schematic elevational diagram of a second preferred embodiment of the physical arrangement of the bypass system.
Figure 8:
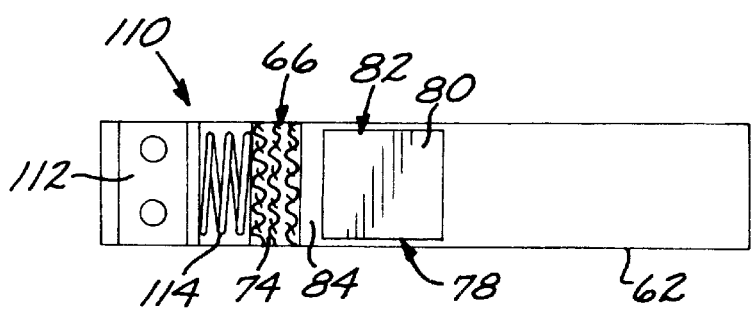
FIG. 8 is a partial plan view of a preferred biasing mechanism used in the embodiment of FIG. 7.

FIGS. 5–8 show two preferred embodiments of a physical arrangement by which the shorting circuitry of FIG. 4 is enabled. FIGS. 5–6 depict a first embodiment, and FIGS. 7–8 depict a second embodiment. The two embodiments are the same, except for the surface tinning to be discussed subsequently. The following description applies to both embodiments, except for the discussion of the surface tinning. The diode 64 is depicted as multiple diodes. A discharging diode 64a may in turn comprise two diodes in parallel. A charging diode 64b may also involve two diodes in parallel, with each diode formed of multiple diode circuits in series. The discharging diode 64a is the primary heating source for responding to the cell failure, and it is preferably positioned closer to the shorting gap 63 than the charging diode 64b. Under some circumstances, the charging diode 64b may respond to the cell failure and serve as the necessary heat source.

The diode(s) 64 are supported on, and in thermal contact with, a surface 72 of one of the electrical conductors, here shown as the second electrical conductor 62. A mass 74 of the fusible material 66 is supported on the same surface 72 at an initial location 76. In these embodiments, the fusible material 66 itself conducts electricity after closing of the switch 68, and it is therefore a metal such as a metal alloy that melts at a low temperature, preferably no more than about 210° C. and most preferably below about 200° C. A lead-tin solder such as the composition 63 weight percent tin-37 weight percent lead, having a melting point of about 183° C., is preferred as the fusible material. Other fusible materials may be used, but any such material must be selected so as to wet the surfaces along which it is to flow.

A biasing mechanism 110 is positioned to force the mass 74 of the fusible material 66 into the shorting gap 63, when the mass 74 of the fusible material 66 is at least partially molten, and most preferably is nearly completely or completely molten. The shorting gap 63 is thereby closed so that the first electrical conductor 60 is in electrical communication with the second electrical conductor 62, shorting the two conductors 60 and 62 together. The biasing mechanism 110 may be of any operable type. In the embodiments of FIGS. 5–8, the biasing mechanism includes a spring support 112 that is affixed to a convenient stationary object such as the second electrical conductor 62. A spring 114, loaded in compression, extends between the spring support 112 and the mass 74 of the fusible material 66. In other embodiments, the spring 114 may be loaded in tension.

The spring 114 applies a biasing force to the mass 74, the direction of the biasing force being such as to push the mass 74 toward the shorting gap 63. The mass 74 does not move in the direction of the shorting gap 63 when the mass 74 is fully solid and not at least partially molten, because it is fused to the surface 72 of the second electrical conductor 62. When the mass 74 is heated and becomes at least partially molten, it moves toward the shorting gap 63 under the influence of the bias force of the spring 114, eventually entering and filling the shorting gap 63. Closure of the shorting gap 63 is therefore not dependent solely upon wetting action and/or capillary action, but is aided by the biasing force of the spring 114.

At least a portion 78 of the surface 72 between the diode 64 and the initial location 76 is preferably plated or otherwise coated with a thin layer 80 of a material, such as the lead-tin solder alloy used as the fusible material 66 or a high-tin alloy, that is wettable by the molten fusible material 66 to promote the flow of the fusible material 66 toward the diode 64, after the fusible material 66 at least partially melts. (This thin layer 80 and its application are sometimes termed in the art "tinning", regardless of the composition of the material in the layer 80.) This portion 78 thereby serves as a flow path 82 extending from the initial mass location 76 or near to the initial mass location into the shorting gap 63 so that molten fusible material is encouraged to flow into the shorting gap. Within the shorting gap 63, both of the electrical conductors 60 and 62 are tinned with the thin layer 80.

The embodiments of FIGS. 5–6 and 7–8 differ as to the extent of the tinned portion 78. In the embodiment of FIGS. 5–6, the flow path 82 extends the entire distance from the initial mass location 76 into the shorting gap 63; that is, it is fully tinned. In the embodiment of FIGS. 7–8, the flow path 82 extends less than the entire distance from the initial mass location 76 into the shorting gap 63, with a break 84 therein near the initial mass location 76; that is, it is partially tinned. The difference in performance is that the fusible material 66 will be moved toward the shorting gap 63 when it is only partially melted in the embodiment of FIGS. 5–6, whereas the fusible material 66 must be nearly completely melted before it will move toward the shorting gap 63 in the embodiment of FIGS. 7–8. The latter is desirable in many applications, so that virtually the entire mass of the fusible material 66 is forced rapidly across the break 84, along the flow path 82, and into the shorting gap 63 in a quick, continuous movement. The result is a rapid decrease in the electrical resistance across the closed shorting gap 63 to a low value that is retained after the fusible material re-solidifies.

The preferred embodiment of the invention is designed for operation in zero-gravity spacecraft environments, and the tinning of the surface 72 produces the wetting that allows the fusible material 66 to flow in the desired direction and to the desired location after it has melted. The fusible material 66 therefore desirably wets the surface 72 very well, and the tinning of the surface 72 by the thin layer 80 produces that wetting. The shorting gap 63 may be made so narrow that the sides of the shorting gap—the bottom surface of the first electrical conductor 60 and the surface 72 of the second electrical conductor 62—together serve as a capillary flow path to draw the molten fusible material from the initial location 76 toward the diode 64 by capillary action. To be effective as a capillary flow path, the shorting gap 63 is typically from about 0.005 inch to about 0.025 inch wide. Both sides of the shorting gap 63 may be tinned as discussed above to promote capillary flow. Although care is taken to promote capillary flow by the tinning and the small separation within the shorting gap 63, the present approach does not rely solely on these effects to achieve the closure of the shorting gap 63. The mechanical biasing force of the biasing mechanism 110 pushes the partially or totally molten mass 74 into shorting gap 63 with a mechanical force.

When the cell 10 fails to an open-cell state, current flows through the diode 64, producing heat. The heat is conducted to the portion 78 of the surface 72 and to the mass 74 through the second electrical conductor 62, which serves as a heat flow path as well as an electrical conductor. The mass 74 of fusible material 66 melts and flows toward the heat source (the diode 64) along the portion 78 of the surface 72, aided by the thin layer 80 and the capillary action within the shorting gap 63. As the molten fusible material enters the gap 63, it begins to serve as an electrical short between the conductors 60 and 62, effectively closing the switch 68 of FIG. 4. The shorting of the gap 63 by the electrically conductive fusible material reduces the electrical resistance of the bypass 58, because the bypassed current now flows through the fusible material rather than through the diode. The heat produced drops by the diode 64 and the fusible material solidifies, permanently closing the shorting gap and completing the bypass circuit, with a shunt of very low electrical resistance.

Figure 9:
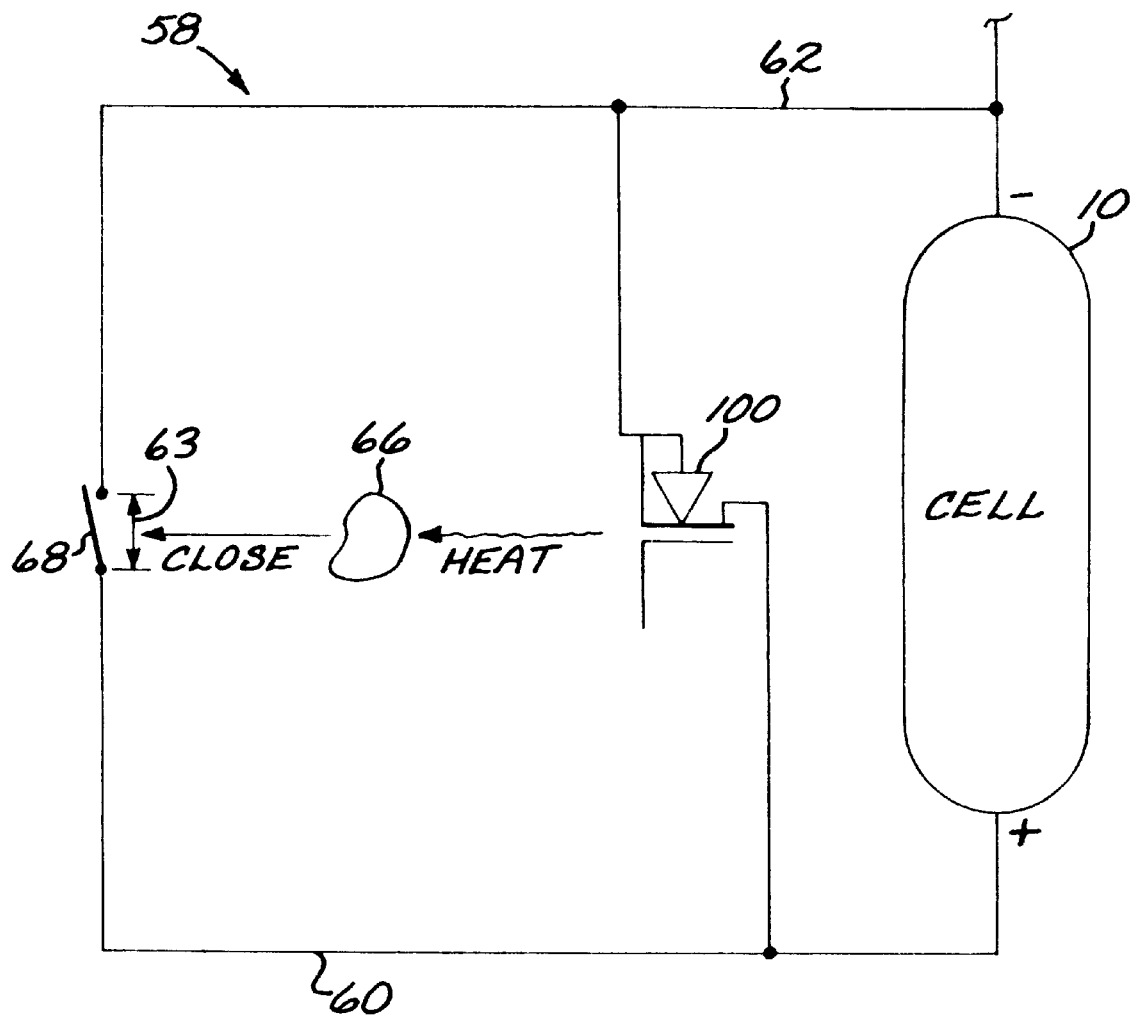
FIG. 9 is a schematic circuit diagram of a third embodiment of a bypass circuit.

Other equivalently functioning active elements may be used instead of the simple-form diode 64 in the bypass 58. FIG. 9 illustrates a bypass 58 utilizing a metal-oxide-semiconductor field effect transistor (MOSFET) 100. The MOSFET 100, which includes and comprises the structure of a high-current diode, is connected in the manner described in relation to FIG. 4. It therefore has an automatic bypass function as described in relation to the diode 64. In this application, the switching capabilities of the diode are not utilized. The term "diode" as used herein encompasses a MOSFET 100 or other device having the diode characteristics. Additionally, the MOSFET 100 may be externally controlled with a trigger signal to bypass the battery current through the MOSFET. The bypass through the MOSFET is turned off by discontinuing the trigger signal. The description of FIG. 4 is incorporated herein as to the other elements of the bypass 58 and the functioning of the bypass 58. The embodiment of FIG. 9 may be used in relation to the circuitry of FIGS. 3 and 5–8, and the discussion of those circuits is incorporated herein with that modification.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A battery system, comprising:
   an electrical storage cell having a positive terminal and a negative terminal;
   a normally open bypass circuit path comprising
      a first electrical conductor connected to the positive terminal of the electrical storage cell,
      a second electrical conductor connected to the negative terminal of the electrical storage cell, and
      a shorting gap between the first electrical conductor and the second electrical conductor;
   a mass of a fusible material positioned at an initial mass location;
   a heat source activatable upon the occurrence of an open-circuit condition of the electrical storage cell, the heat source being operable to melt at least a portion of the mass of the fusible material; and
   a biasing mechanism positioned to force the mass of the fusible material from the initial location and into the shorting gap, when the mass of the fusible material is at least partially molten, thereby closing the shorting gap so that the first electrical conductor is in electrical communication with the second electrical conductor.

2. The battery system of claim 1, wherein the heat source comprises at least one diode.

3. The battery system of claim 1, wherein the heat source comprises at least one diode having a cathode and an anode, the cathode of the diode being electrically connected to the positive terminal of the electrical storage cell and the anode of the diode being electrically connected to the negative terminal of the electrical storage cell.

4. The battery system of claim 1, further including
   a heat conductor between the heat source and the mass of the fusible material.

5. The battery system of claim 1, wherein the fusible material is an electrical conductor, and wherein the battery system further includes
   a flow path extending from the initial mass location into the shorting gap so that molten fusible material flows into the shorting gap.

6. The battery system of claim 5, wherein the flow path is fully tinned.

7. The battery system of claim 5, wherein the flow path is partially tinned.

8. The battery system of claim 1, wherein the fusible material is a metal.

9. The battery system of claim 1, wherein the fusible material is a metallic alloy.

10. The battery system of claim 9, wherein the metallic alloy has a melting point of no more than about 210° C.

11. The battery system of claim 9, wherein the metallic alloy is a lead-tin alloy.

12. The battery system of claim 1, wherein the biasing mechanism comprises
   a spring positioned to move the mass of the fusible material toward the shorting gap.

13. The battery system of claim 1, wherein the battery system further comprises
   a second electrical storage cell connected to the electrical storage cell in an electrical series relationship.

14. A battery system, comprising:
   an electrical storage cell having a positive terminal and a negative terminal;
   a normally open bypass circuit path comprising
      a first electrical conductor connected to the positive terminal of the electrical storage cell,
      a second electrical conductor connected to the negative terminal of the electrical storage cell, and
      a shorting gap between the first electrical conductor and the second electrical conductor;
   a mass of a fusible metallic alloy positioned at an initial mass location;
   a diode having a cathode and an anode, the cathode of the diode being electrically connected to the positive terminal of the electrical storage cell and the anode of the diode being electrically connected to the negative terminal of the electrical storage cell heat source activatable upon the occurrence of an open-circuit condition of the electrical storage cell, the diode having a sufficient heat output to melt the mass of the fusible metallic alloy;
   a metal flow path extending from the initial mass location into the shorting gap so that molten fusible metallic alloy flows into the shorting gap; and
   a spring positioned to force the mass of the fusible metallic alloy from the initial mass location, along the metal flow path, and into the shorting gap, when the mass of the fusible metallic alloy is at least partially molten.

15. The battery system of claim 14, wherein the battery system further comprises
   a second electrical storage cell connected to the electrical storage cell in an electrical series relationship.

16. The battery system of claim 14, wherein the metallic alloy has a melting point of no more than about 210° C.

17. The battery system of claim 14, wherein the metallic alloy is a lead-tin alloy.

18. The battery system of claim 14, wherein the metal flow path is fully tinned.

19. The battery system of claim 14, wherein the metal flow path is partially tinned.

* * * * *